(12) United States Patent
Fleischman et al.

(10) Patent No.: US 8,466,543 B2
(45) Date of Patent: Jun. 18, 2013

(54) THREE DIMENSIONAL STACKED PACKAGE STRUCTURE

(75) Inventors: Thomas J. Fleischman, Hopewell Junction, NY (US); Eric D. Perfecto, Hopewell Junction, NY (US); Sudipta K. Ray, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 12/789,316

(22) Filed: May 27, 2010

(65) Prior Publication Data

US 2011/0291261 A1 Dec. 1, 2011

(51) Int. Cl.
| | |
|---|---|
| H01L 23/02 | (2006.01) |
| H01L 23/48 | (2006.01) |
| H01L 23/52 | (2006.01) |
| H01L 29/40 | (2006.01) |

(52) U.S. Cl.
USPC .......................................... 257/686; 257/777

(58) Field of Classification Search
USPC ................. 257/688–700, 734–738, 777–786, 257/E23.085
See application file for complete search history.

(56) References Cited

U.S. PATENT DOCUMENTS

| | | | |
|---|---|---|---|
| 5,691,209 A | 11/1997 | Liberkowski | |
| 6,794,741 B1 | 9/2004 | Lin et al. | |
| 7,091,592 B2 | 8/2006 | Chen et al. | |
| 7,279,363 B2 | 10/2007 | Cherukuri et al. | |
| 7,285,850 B2 | 10/2007 | Poo et al. | |
| 7,518,225 B2 | 4/2009 | Emma et al. | |
| 7,524,699 B2 | 4/2009 | Fuergut et al. | |
| 7,545,029 B2 | 6/2009 | Wilson et al. | |
| 7,576,434 B2 | 8/2009 | Mancera et al. | |
| 8,072,059 B2 * | 12/2011 | Shim et al. | 257/698 |
| 8,143,082 B2 * | 3/2012 | Dungan et al. | 438/50 |
| 2005/0167798 A1 * | 8/2005 | Doan | 257/678 |
| 2007/0096160 A1 | 5/2007 | Beroz | |
| 2008/0227237 A1 | 9/2008 | Lin et al. | |
| 2009/0045523 A1 | 2/2009 | Fan et al. | |
| 2009/0174070 A1 | 7/2009 | Ramanathan et al. | |
| 2009/0321959 A1 * | 12/2009 | Hedler et al. | 257/777 |

FOREIGN PATENT DOCUMENTS

WO 2009016497 A2 2/2009

OTHER PUBLICATIONS

Lin, 3D Stackable Packages With Bumpless Interconnect Technology, Electronics Packaging Technology Conference, 2003, pp. 8-12, Downloaded on Nov. 15, 2009 from IEEE Xplore.

(Continued)

*Primary Examiner* — Cuong Q Nguyen
(74) *Attorney, Agent, or Firm* — Kunzler Law Group, PC

(57) ABSTRACT

An apparatus, system, and method are disclosed for connecting integrated circuit devices. A plurality of primary electrically conductive contacts and a plurality of primary electrically conductive pillars are electrically coupled to a primary integrated circuit device. The plurality of primary electrically conductive contacts form a pattern corresponding to secondary electrically conductive contacts disposed on one or more secondary integrated circuit devices. The plurality of primary electrically conductive pillars extends away from the primary integrated circuit device. The plurality of primary electrically conductive pillars forms a pattern that corresponds to substrate electrically conductive contacts that are disposed on a substrate. The plurality of primary electrically conductive pillars and associated connecting material provide a standoff height between the primary integrated circuit device and the substrate that is greater than or equal to a height of the one or more secondary integrated circuit devices.

25 Claims, 9 Drawing Sheets

OTHER PUBLICATIONS

IBM TDB, Integrated Stacking Spacer for Enhanced Semiconductor Packaging, IP.com Prior Art Database Technical Disclosure, Nov. 1, 1878, pp. 0-3.

IBM, Inverse Dual Damascene Pillar Structure for Chip-to-Package and 3D IC Connections, IP.com Prior Art Database Technical Disclosure, Apr. 9, 2009, pp. 0-4.

IBM TDB, Mechanism for Attaching Standoffs to Module Pins, IP.com Prior Art Database Tech;nical Disclosure, Apr. 1, 1988, pp. 0-1.

IBM TDB, Method of Joining Multilayer Ceramic Substrates to Printed Circuit, IP.com Prior Art Database Technical Disclosure, Oct. 1, 1980, pp. 0-2.

IBM TDB, Short Pin Standoff Method, IP.com Prior Art Database Technical Disclosure, Jul. 1, 1988, pp. 0-1.

IBM TDB, Universal Electronic Package, IP.com Prior Art Database Technical Disclosure, Nov. 1, 1984, pp. 0-2.

PCT/EP2011/05777, International Search Report and Written Opinion, Aug. 30, 2011.

* cited by examiner

THREE DIMENSIONAL STACKED PACKAGE STRUCTURE

FIELD

The subject matter disclosed herein relates to integrated circuits and more particularly relates to a stacked package structure for integrated circuits.

BACKGROUND

Description of the Related Art

Integrated circuits are used in most modern electrical devices. Many electrical devices use several different integrated circuit chips. The different integrated circuit chips or associated packages are often mounted on a printed circuit board or other chip carrier. In such a configuration, the size of the printed circuit board or other chip carrier must be large enough to accommodate each of the different integrated circuit chips.

Additionally, resistances in the electrical connections and carriers between the integrated circuit chips can cause a voltage drop, referred to as an IR drop. The inductance of the electrical connections and carriers can also increase the voltage drop. Inductive coupling losses increase as the speed of the signals from the integrated circuit chips increase. These voltage drops can reduce switching speeds, add interference to signals, and even lead to device failures. Increasing current densities to combat these issues can lead to failures in the electrical connections due to electromigration within the connections.

Further, as additional functionality is added to electrical devices, the number of different integrated circuit chips in each electrical device often increases as well. Similarly, the sizes of some individual integrated circuit chips are also increasing, as functionality is added and consolidated from several different integrated circuit chips into a single chip. In contrast to the rising sizes and numbers of integrated circuit chips, consumers are demanding smaller, more portable electrical devices. Mounting integrated circuit chips linearly on a printed circuit board requires that an electrical device be at least as large as the combined surface areas of the integrated circuit chips on the printed circuit board.

BRIEF SUMMARY

From the foregoing discussion, it should be apparent that a need exists for an apparatus, system, and method that stack integrated circuit devices. Beneficially, such an apparatus, system, and method would provide a three dimensional stacked package structure for integrated circuit devices.

The present invention has been developed in response to the present state of the art, and in particular, in response to the problems and needs in the art that have not yet been fully solved by currently available integrated circuit device package structures. Accordingly, the present invention has been developed to provide an apparatus, system, and method for connecting integrated circuit devices that overcome many or all of the above-discussed shortcomings in the art.

The apparatus to connect integrated circuit devices is provided with a plurality of elements. These elements in the described embodiments include a primary integrated circuit device, a plurality of primary electrically conductive contacts, and a plurality of primary electrically conductive pillars.

The plurality of primary electrically conductive contacts, in one embodiment, is electrically coupled to a surface of the primary integrated circuit device. In a further embodiment, the plurality of primary electrically conductive contacts form a pattern corresponding to secondary electrically conductive contacts disposed on one or more secondary integrated circuit devices.

The plurality of primary electrically conductive pillars, in one embodiment, is also electrically coupled to the surface of the primary integrated circuit device. The plurality of primary electrically conductive pillars, in a further embodiment, extends away from the surface of the primary integrated circuit device. In another embodiment, the plurality of primary electrically conductive pillars form a pattern corresponding to substrate electrically conductive contacts disposed on a substrate. The plurality of primary electrically conductive pillars and associated connecting material, in one embodiment, provide a standoff height between the primary integrated circuit device and the substrate that is greater than or equal to a height of the one or more secondary integrated circuit devices.

The system to connect integrated circuit devices is also provided with a plurality of elements. These elements in the described embodiments include a primary integrated circuit device, one or more secondary integrated circuit devices, a substrate, a plurality of primary electrically conductive contacts, and a plurality of primary electrically conductive pillars.

The plurality of primary electrically conductive contacts, in one embodiment, is electrically coupled to a surface of the primary integrated circuit device. In a further embodiment, the plurality of primary electrically conductive contacts is also electrically coupled to a plurality of secondary electrically conductive contacts on the one or more secondary integrated circuit devices.

The plurality of primary electrically conductive pillars, in one embodiment, is electrically coupled to the surface of the primary integrated circuit device. The plurality of primary electrically conductive pillars, in a further embodiment, is electrically coupled to substrate electrically conductive contacts on the substrate. In one embodiment, the plurality of primary electrically conductive pillars extends away from the surface of the primary integrated circuit device. The plurality of primary electrically conductive pillars and associated connecting material, in one embodiment, provide a standoff height between the primary integrated circuit device and the substrate that is greater than or equal to a height of the one or more secondary integrated circuit devices.

A method of the present invention is also presented to for connecting integrated circuit devices. The method in the disclosed embodiments substantially includes the steps necessary to carry out the functions presented above with respect to the operation of the described apparatus and system. In one embodiment, the method includes electrically coupling a plurality of primary electrically conductive contacts to a surface of a primary integrated circuit device. In a further embodiment, the method includes electrically coupling a plurality of primary electrically conductive pillars to the surface of the primary integrated circuit device.

In one embodiment, the plurality of primary electrically conductive contacts forms a pattern corresponding to secondary electrically conductive contacts disposed on one or more secondary integrated circuit devices. In another embodiment, the plurality of primary electrically conductive pillars forms a pattern corresponding to substrate electrically conductive contacts disposed on a substrate. In a further embodiment, the plurality of primary electrically conductive pillars extends away from the surface of the primary integrated circuit device. The plurality of primary electrically conductive pillars and associated connecting material, in one embodiment, provide a standoff height between the primary integrated circuit device and the substrate that is greater than or equal to a height of the one or more secondary integrated circuit devices.

Another apparatus to connect integrated circuit devices is provided with a plurality of elements. These elements in the described embodiments include a primary integrated circuit device, one or more secondary integrated circuit devices, a plurality of primary electrically conductive contacts, a plurality of primary electrically conductive pillars, and a plurality of secondary electrically conductive pillars.

The plurality of primary electrically conductive contacts, in one embodiment, is electrically coupled to a surface of the primary integrated circuit device. In a further embodiment, the plurality of primary electrically conductive contacts are electrically coupled to corresponding secondary electrically conductive contacts disposed on the one or more secondary integrated circuit devices.

The plurality of primary electrically conductive pillars, in one embodiment, is also electrically coupled to the surface of the primary integrated circuit device. The plurality of primary electrically conductive pillars, in a further embodiment, extends away from the surface of the primary integrated circuit device. In another embodiment, the plurality of primary electrically conductive pillars form a pattern corresponding to substrate electrically conductive contacts disposed on a substrate. The plurality of primary electrically conductive pillars and associated connecting material, in one embodiment, provide a standoff height between the primary integrated circuit device and the substrate that is greater than or equal to a height of the one or more secondary integrated circuit devices.

In one embodiment, the plurality of secondary electrically conductive pillars extends from at least one of the one or more secondary integrated circuit devices. The plurality of secondary electrically conductive pillars, in a further embodiment, are disposed on an opposite side of the at least one secondary integrated circuit device as the secondary electrically conductive contacts are. The plurality of secondary electrically conductive pillars, in one embodiment, forms a pattern corresponding to additional substrate electrically conductive contacts disposed on the substrate. In another embodiment, a height of the plurality of secondary electrically conductive pillars and associated connecting material is sized to match the standoff height provided by the plurality of primary electrically conductive pillars and associated connecting material.

Another system to connect integrated circuit devices is also provided with a plurality of elements. These elements in the described embodiments include a primary integrated circuit device, one or more secondary integrated circuit devices, one or more tertiary integrated circuit devices, a substrate, a plurality of primary electrically conductive contacts, a plurality of primary copper pillars, a plurality of secondary copper pillars, and a plurality of tertiary copper pillars.

The plurality of primary electrically conductive contacts, in one embodiment, is disposed on a surface of the primary integrated circuit device. In a further embodiment, the plurality of primary electrically conductive contacts is electrically coupled to a plurality of secondary electrically conductive contacts on the one or more secondary integrated circuits.

The plurality of primary copper pillars, in one embodiment, is disposed on the surface of the primary integrated circuit device. The plurality of primary copper pillars, in a further embodiment, is electrically coupled to substrate electrically conductive contacts on the substrate. In one embodiment, the plurality of primary copper pillars extends away from the surface of the primary integrated circuit device. The plurality of primary electrically conductive pillars and associated connecting material, in one embodiment, provide a standoff height between the primary integrated circuit device and the substrate that is greater than or equal to a combined height of the one or more secondary integrated circuit devices, the one or more tertiary integrated circuit devices, and associated connecting material.

The one or more tertiary integrated circuit devices, in one embodiment, are disposed adjacent to at least one of the one or more secondary integrated circuit devices, so that the secondary integrated circuit device is between the tertiary integrated circuit devices and the primary integrated circuit device. In a further embodiment, the primary integrated circuit device, the one or more secondary integrated circuit devices, the one or more tertiary integrated circuit devices, and the substrate are arranged in a stack. The one or more secondary integrated circuit devices and the one or more tertiary integrated circuit devices, in one embodiment, are between the primary integrated circuit device and the substrate in the stack.

The plurality of secondary copper pillars, in one embodiment, extends from at least one of the one or more secondary integrated circuit devices. In a further embodiment, the plurality of secondary copper pillars is disposed on an opposite side of the at least one secondary integrated circuit device as the secondary electrically conductive contacts are. The plurality of secondary copper pillars, in one embodiment, is electrically coupled to additional substrate electrically conductive contacts on the substrate. In one embodiment, a height of the secondary copper pillars and associated connecting material is sized to match the standoff height provided by the plurality of primary electrically conductive pillars and associated connecting material.

The plurality of tertiary copper pillars, in one embodiment, extends from a surface of at least one of the one or more tertiary integrated circuit devices. The plurality of tertiary copper pillars, in a further embodiment, is electrically coupled to additional substrate electrically conductive contacts on the substrate. In one embodiment, a height of the tertiary copper pillars and associated connecting material is sized to match the standoff height provided by the plurality of primary electrically conductive pillars and associated connecting material.

References throughout this specification to features, advantages, or similar language do not imply that all of the features and advantages may be realized in any single embodiment. Rather, language referring to the features and advantages is understood to mean that a specific feature, advantage, or characteristic is included in at least one embodiment. Thus, discussion of the features and advantages, and similar language, throughout this specification may, but do not necessarily, refer to the same embodiment.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
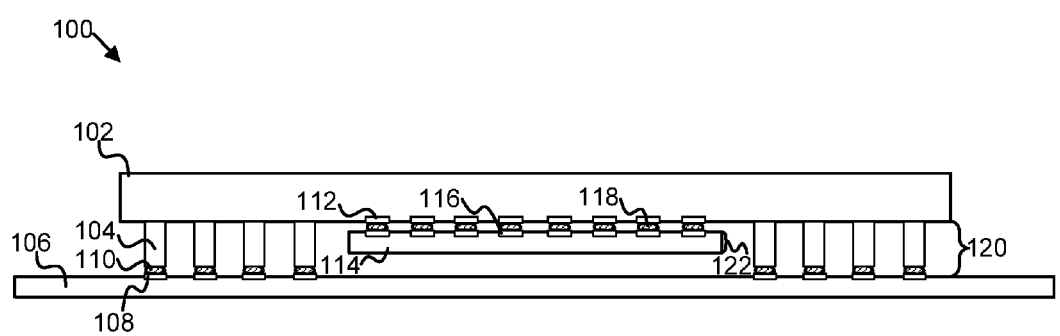
FIG. 1 is a schematic block diagram illustrating one embodiment of a system to connect integrated circuit devices in accordance with the present invention.

As will be appreciated by one skilled in the art, aspects of the present invention may be embodied as an apparatus, system, or method. Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments of the invention may be combined in any suitable manner. In the following description, numerous specific details are provided to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

The schematic flowchart diagrams and/or schematic block diagrams in the Figures illustrate the architecture, functionality, and operation of possible implementations of apparatuses, systems, and methods according to various embodiments of the present invention. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable program code.

FIG. 1 depicts a cross-sectional side view of one embodiment of a system 100 to connect integrated circuit devices. In the depicted embodiment, the system 100 includes a primary integrated circuit device 102 with primary electrically conductive pillars 104 for connecting the primary integrated circuit device 102 to substrate electrically conductive contacts 108 on a substrate 106 using substrate connecting material 110. In the depicted embodiment, the primary integrated circuit device 102 includes primary electrically conductive contacts 112 for connecting the primary integrated circuit device 102 to secondary electrically conductive contacts 116 on a secondary integrated circuit device 114 using secondary connecting material 118. The primary integrated circuit device 102, the secondary integrated circuit device 114, and the substrate 106, in the depicted embodiment, are arranged in a three dimensional stack with the secondary integrated circuit device 114 between the primary integrated circuit device 102 and the substrate 106.

In the depicted embodiment, the primary electrically conductive pillars 104 and the associated substrate connecting material 110 provide a standoff height 120 between the primary integrated circuit device 102 and the substrate 106 that is greater than a height 122 of the secondary integrated circuit device 114. As depicted, this allows the secondary integrated circuit device 114 to be placed between the primary integrated circuit device 102 and the substrate 106 instead of being placed elsewhere in the system 100, such as directly on the substrate 106 to the side of the primary integrated circuit device 102 or the like. In one embodiment, placing the secondary integrated circuit device 114 between the primary integrated circuit device 102 and the substrate 106 as depicted may decrease the size of the substrate 106 and/or the system 100 and may decrease electrical interference and inefficiencies in comparison to placing the secondary integrated circuit device 114 directly on the substrate 106 to the side of the primary integrated circuit device 102 or the like.

In the depicted embodiment, the primary integrated circuit device 102 is a flip-chip type integrated circuit device, with an array of electrical contacts distributed over an entire side of the die, rather than solely along a periphery. The primary integrated circuit device 102 may include an analog, digital, or mixed signal integrated circuit, such as a processor, controller, memory, graphics processing unit ("GPU"), sensor, amplifier, signal processor, signal converter, or other integrated circuit device. In other embodiments, the primary integrated circuit device 102 has electrical contacts along one or more sides rather than over an entire underside, or may have only certain areas with electrical contacts. One of skill in the art, in view of the present disclosure, will recognize other configurations of electrical contacts on a primary integrated circuit device 102 suitable for the invention described herein.

In the depicted embodiment, the array of electrical contacts on the primary integrated circuit device 102 includes the primary electrically conductive pillars 104 and the primary electrically conductive contacts 112. The primary electrically conductive pillars 104 and the primary electrically conductive contacts 112, in the depicted embodiment, are disposed on and electrically coupled to a surface of the primary integrated circuit device 102. In a further embodiment, the primary electrically conductive pillars 104 and the primary electrically conductive contacts 112 may be disposed on an interposer layer and electrically coupled to the surface of the primary integrated circuit device 102 through the interposer.

In the depicted embodiment, the primary electrically conductive pillars 104 extend away from the surface of the primary integrated circuit device 102 to provide the standoff height 120 between the primary integrated circuit device 102 and the substrate 106. In addition to providing the standoff height 120, in one embodiment, using the primary electrically conductive pillars 104 as electrical contacts reduces the effects of electromigration in the joints formed by the substrate connecting material 110 because materials, like copper, that may be used for the primary electrically conductive pillars 104 typically have better electromigration performance than does the substrate connecting material 110, which may include solder and the like.

In order to act as input/output contacts for the primary integrated circuit device 102, the primary electrically conductive pillars 104 and the primary electrically conductive contacts 112 may be part of, connected to, integrated with, electrically coupled to, and/or otherwise in electrical communication with internal connections of the primary integrated circuit device 102. For example, the primary electrically conductive pillars 104 may be plated onto a seed layer of a contact pad on the primary integrated circuit device 102 using a resist coat or other mask to define a pillar area on the contact pad, may be evaporated through a suitable mask, or may be otherwise electrically coupled to an electrical contact of the primary integrated circuit device 102. A process of plating the primary electrically conductive pillars 104 onto an electrical contact may include several treatments. In one embodiment, the primary electrically conductive contacts 112 may undergo a similar process with fewer treatments. The primary electrically conductive pillars 104 and the primary electrically conductive contacts 112 form an array of electrical contacts disposed on the primary integrated circuit device 102.

In one embodiment, the primary electrically conductive pillars 104 and the primary electrically conductive contacts 112 are made of copper, such as pure copper, a copper alloy, plated copper, or the like. For example, in one embodiment, the primary electrically conductive pillars 104 and/or the primary electrically conductive contacts 112 may include a copper nickel alloy, a copper silver alloy, a copper palladium alloy, another alloy that maintains solder wettability of the primary electrically conductive pillars 104, or may be plated with nickel, cobalt, or the like. A layer of plating on the primary electrically conductive pillars 104 and/or on the primary electrically conductive contacts 112 typically acts as a barrier layer to decrease the inter-metallic formation that may occur in a reaction with the substrate connecting material 110 and/or the secondary connecting material 118.

In other embodiments, the primary electrically conductive pillars 104 and/or the primary electrically conductive contacts 112 may include another electrically conductive material, such as nickel, gold, a nickel gold alloy, a nickel copper alloy, or the like. The primary electrically conductive pillars 104, in one embodiment, are formed of a material with a melting temperature that is higher than a melting temperature of the substrate connecting material 110. The higher melting temperature of the primary electrically conductive pillars 104, in one embodiment, allows the primary electrically conductive pillars 104 to substantially maintain their height and shape during a reflow process that melts the substrate connecting material 110.

In the depicted embodiment, the primary electrically conductive pillars 104 are disposed on the primary integrated circuit device 102 in a pattern, such that the primary electrically conductive pillars 104 correspond to the substrate electrically conductive contacts 108 on the substrate 106. In one embodiment, at least a portion of the primary electrically conductive pillars 104 are disposed toward a perimeter of the primary integrated circuit device 102 such that the primary electrically conductive pillars 104 may support the primary integrated circuit device 102 when placed on the substrate 106 prior to connection.

In the depicted embodiment, the primary electrically conductive contacts 112 are disposed on the primary integrated circuit device 102 in a pattern, such that the primary electrically conductive contacts 112 correspond to the secondary electrically conductive contacts 116 disposed on the secondary integrated circuit device 114. The pattern formed by the primary electrically conductive contacts 112, in the depicted embodiment, does not overlap the pattern formed by the primary electrically conductive pillars 104, such that the primary electrically conductive pillars 104 do not interfere with placement of the secondary integrated circuit device 114.

In the depicted embodiment, like the primary integrated circuit device 102, the secondary integrated circuit device 114 is a flip-chip type integrated circuit device, with an array of electrical contacts distributed over an entire side of the die, rather than solely along a periphery. The secondary integrated circuit device 114 may include an analog, digital, or mixed signal integrated circuit, such as a processor, controller, memory, graphics processing unit ("GPU"), sensor, amplifier, signal processor, signal converter, or other integrated circuit device.

In one embodiment, the secondary integrated circuit device 114 includes one or more support devices for the primary integrated circuit device 102. For example, in one embodiment, the primary integrated circuit device 102 may include a processor or the like, and the secondary integrated circuit device 114 may include volatile memory such as dynamic random access memory ("DRAM") or static random access memory ("SRAM"), non-volatile data storage such as flash memory, a GPU, a logic controller, a memory controller, and/or other support device integrated circuits. In one embodiment, electrically coupling the secondary integrated circuit device 114 directly to the primary integrated circuit device 102 may increase electrical efficiency, reduce electrical interference, reduce communication times, reduce the size of the system 100, and the like.

In the depicted embodiment, the array of electrical contacts on the secondary integrated circuit device 114 includes the secondary electrically conductive contacts 116. In one embodiment, the secondary electrically conductive contacts 116 are substantially similar to the primary electrically conductive contacts 112. In a further embodiment, the secondary electrically conductive contacts 116 may include pillars that are substantially similar to the primary electrically conductive pillars 104, but with a shorter height.

In the depicted embodiment, the secondary electrically conductive contacts 116 are disposed in a pattern corresponding to the pattern of the primary electrically conductive contacts 112. In the depicted embodiment, a surface area of the primary integrated circuit device 102 is larger than a surface area of an opposing surface of the secondary integrated circuit device 114 that faces the surface of the primary integrated circuit device 102. The larger surface area of the primary integrated circuit device 102 provides room for the primary electrically conductive pillars 104 on the surface of the primary integrated circuit device 102.

In one embodiment, the primary integrated circuit device 102 may include one or more secondary integrated circuit devices 114 mounted on an opposite side of the primary integrated circuit device 102. For example, in one embodiment, the primary integrated circuit device 102 may include additional primary electrically conductive contacts 112 disposed on an opposite side of the primary integrated circuit device 102 as the depicted electrically conductive contacts 112, and a secondary integrated circuit device 114 may be electrically coupled to the primary electrically conductive contacts 112 on the opposite side of the primary integrated circuit device 102. In a further embodiment, the primary integrated circuit device 102 may include one or more internal electrical connections, such as through-silicon vias or the like, electrically coupling primary electrically conductive contacts 112 on opposite sides of the primary integrated circuit device 102 and/or connecting one or more primary electrically conductive contacts 112 to internal electrical components within the primary integrated circuit device 102.

In the depicted embodiment, the primary integrated circuit device 102 is electrically coupled to the substrate 106. In one embodiment, the substrate 106 is a chip carrier that provides electrical connections and structural support for the primary integrated circuit device 102. The substrate 106 may connect the primary integrated circuit device 102 to external circuitry. The substrate 106 may itself include external circuitry, may include connectors or contacts for connection with external circuitry, or both.

For example, in one embodiment, the substrate 106 may include a printed circuit board upon which the primary integrated circuit device 102 is directly mounted, or the substrate 106 may be a base portion of a flip-chip assembly that interfaces with additional circuitry or connectors, such as a land grid array socket, a pin grid array socket, a ball grid array, an edge connector socket, or the like. In various embodiments, the substrate 106 may include an organic laminate, a ceramic, a conductor such as copper, an insulating dielectric, and/or other substrate materials or layers. The substrate 106 may include multiple layers, such as electrically conductive layers, insulating layers, structural support layers, stiffening layers, heat dissipation layers, and the like.

In one embodiment, the substrate electrically conductive contacts 108 are disposed on the substrate 106 facing the primary integrated circuit device 102. The substrate electrically conductive contacts 108 provide a mounting surface for the primary integrated circuit device 102. The substrate electrically conductive contacts 108 further provide electrical contacts for the primary electrically conductive pillars 104.

The substrate electrically conductive contacts 108, in various embodiments, may be made of an electrically conductive material, may be metalized, plated, or the like to facilitate a solder connection between the substrate electrically conductive contacts 108 and the primary electrically conductive pillars 104, and/or may be otherwise configured or prepared for an electrical connection with the primary electrically conductive pillars 104. The substrate electrically conductive contacts 108, in the depicted embodiment, are disposed in a pattern on the substrate 106 and the primary electrically conductive pillars 104 are disposed in a similar pattern on the primary integrated circuit device 102.

The substrate 106, in a further embodiment, may include one or more electrical connections, such as traces, vias, pins, wires, connectors, or the like, that connect to the substrate electrically conductive contacts 108. For example, the substrate 106 may electrically connect the substrate electrically conductive contacts 108 with one or more electronic elements, one or more additional contacts, one or more electrical connectors, or the like. In one embodiment, the substrate 106 may include additional electrically conductive contacts to electrically interface with additional circuitry or connectors, such as a land grid array socket, a pin grid array socket, a ball grid array, an edge connector socket, or the like. For example, an array of additional electrical contacts that are in electrical communication with the substrate electrically conductive contacts 108 may be disposed on an opposite side of the substrate 106, along an edge of the substrate 106, or the like.

In the depicted embodiment, the substrate connecting material 110 electrically couples the primary electrically conductive pillars 104 to the substrate electrically conductive contacts 108 and the secondary connecting material 118 electrically couples the primary electrically conductive contacts 112 to the secondary electrically conductive contacts 116. The substrate connecting material 110 and/or the secondary connecting material 118, in one embodiment, may include a lead-tin solder such as a eutectic or other lead-tin solder, a lead-free solder, or other type of solder capable of providing an electrical and structural connection. Lead-free solders include tin-silver solder, tin-silver-copper solder, and the like. In a further embodiment, the type of solder selected for the substrate connecting material 110 may be different than the type of solder selected for the secondary connecting material 118. In another embodiment, the substrate connecting material 110 and/or the secondary connecting material 118 may include a non-solder electrical coupling material, such as electrochemical plating or the like.

In one embodiment, the substrate connecting material 110, prior to connection/reflow soldering, may be initially disposed on the primary electrically conductive pillars 104, the substrate electrically conductive contacts 108, or both. Similarly, in one embodiment, the secondary connecting material 118, prior to connection/reflow soldering, may be initially disposed on the primary electrically conductive contacts 112, the secondary electrically conductive contacts 116, or both.

In response to melting during reflow soldering, in one embodiment, the substrate connecting material 110 connects the primary electrically conductive pillars 104 both electrically and structurally to the substrate electrically conductive contacts 108 and the secondary connecting material 118 connects the primary electrically conductive contacts 112 both electrically and structurally to the secondary electrically conductive contacts 116. In one embodiment, a first reflow soldering process connects the primary electrically conductive contacts 112 to the secondary electrically conductive contacts 116 and a second reflow soldering process connects the primary electrically conductive pillars 104 to the substrate electrically conductive contacts 108.

In the depicted embodiment, the primary electrically conductive pillars 104 and the associated substrate connecting material 110 together provide the standoff height 120 between the primary integrated circuit device 102 and the substrate 106. In one embodiment, the substrate connecting material 110 and the secondary connecting material 118 each have a substantially similar height. In a further embodiment, the substrate connecting material 110 has a height that is greater than the secondary connecting material 118 to provide the standoff height 120.

The standoff height 120, in the depicted embodiment, provides clearance for the secondary integrated circuit device 114 and the associated secondary connecting material 118 between the primary integrated circuit device 102 and the substrate 106. In one embodiment, the standoff height 120 is greater than or equal to the height 122 of the secondary integrated circuit device 114. In a further embodiment, the standoff height 120 is greater than or equal to a combined height of the secondary integrated circuit device 114 and the associated secondary connecting material 118.

For example, in one embodiment, the standoff height 120 provided by the primary electrically conductive pillars 104 and the associated substrate connecting material 110 is between about 50-100 micrometers and the height 122 of the secondary integrated circuit device 114 is less than about 50-100 micrometers. For example, the height 122 of the secondary integrated circuit device 114, in one embodiment, may be between about 35-40 micrometers or less.

Figure 2:
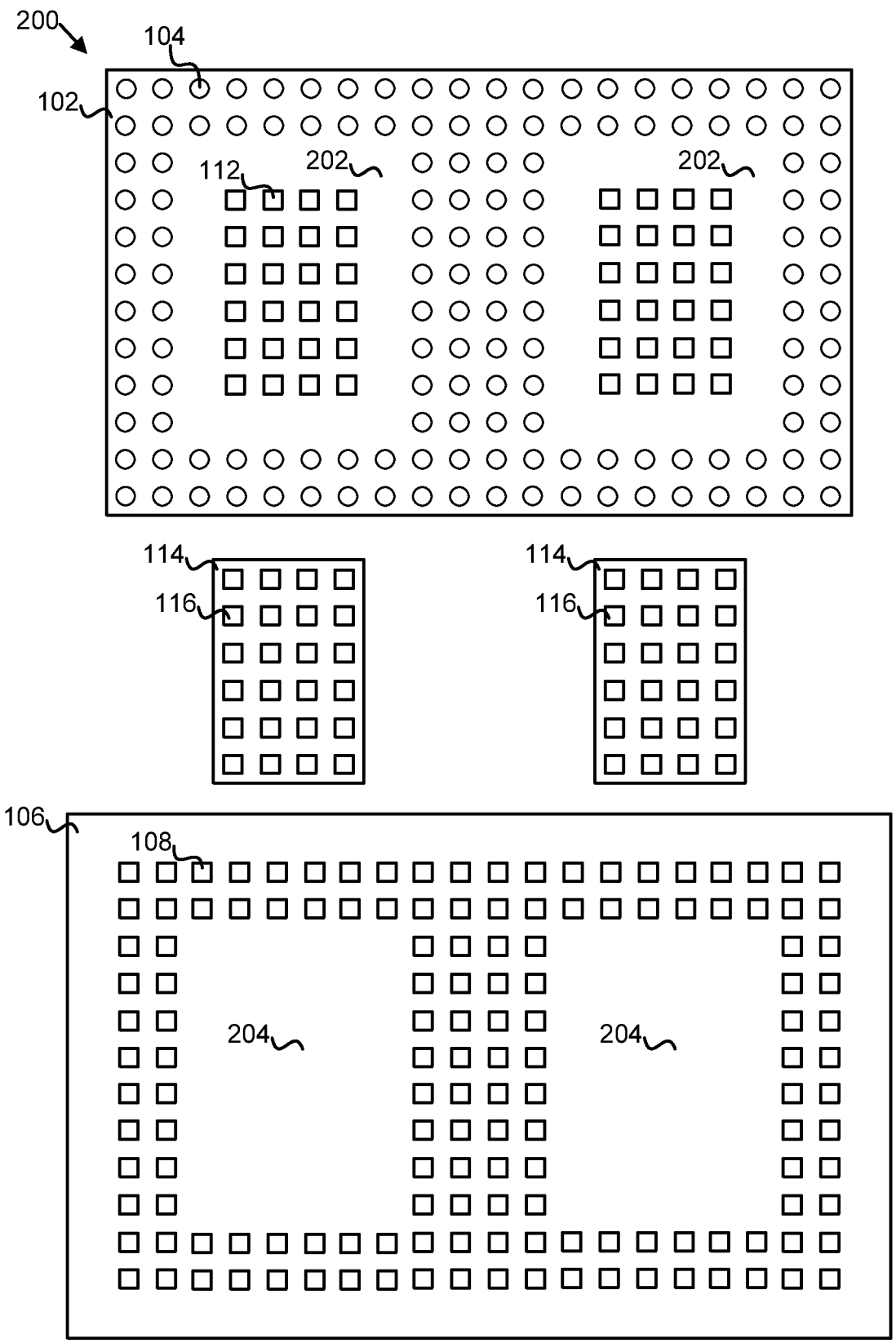
FIG. 2 is a schematic block diagram illustrating one embodiment of integrated circuit devices and a substrate in accordance with the present invention.

FIG. 2 depicts another embodiment 200 of the primary integrated circuit device 102, two secondary integrated circuit devices 114, and the substrate 106. In the depicted embodiment 200, the primary integrated circuit device 102 includes a space 202 around each pattern of primary electrically conductive contacts 112 to provide room for the two secondary integrated circuit devices 114. Similarly, in the depicted embodiment 200, the substrate 106 includes a space 204 for each secondary integrated circuit device 114. While the depicted embodiment 200 includes two secondary integrated circuit devices 114, in a further embodiment, three, four, or as many secondary integrated circuit devices 114 as fit on the primary integrated circuit device 102 may be included.

Additionally, in the depicted embodiment 200, for purposes of differentiation, the primary electrically conductive pillars 104 are illustrated as circles and the primary electrically conductive contacts 112, the secondary electrically conductive contacts 116, and the substrate electrically conductive contacts 108 are illustrated as squares. In a further embodiment, other shapes and/or combinations of shapes may be used. For example, in another embodiment, the primary electrically conductive pillars 104, the primary electrically conductive contacts 112, the secondary electrically conductive contacts 116, and the substrate electrically conductive contacts 108 may each be circular, or other combinations of circles, squares, rectangles, ovals, triangles, octagons, and the like may be used.

In the depicted embodiment 200, the primary electrically conductive contacts 112 form a pattern corresponding to the secondary electrically conductive contacts 116 disposed on each of the two secondary integrated circuit devices 114. The primary electrically conductive pillars 104, in the depicted embodiment 200, form a pattern corresponding to the substrate electrically conductive contacts 108. In the depicted embodiment 200, the pattern of the primary electrically conductive pillars 104 surrounds the patterns of the primary electrically conductive contacts 112, with spaces 202 between the primary electrically conductive pillars 104 and the primary electrically conductive contacts 112. In a further embodiment, other arrangements of primary electrically conductive pillars 104 and primary electrically conductive contacts 112 may be used that provide mechanical support for the primary integrated circuit device 102 on the substrate 106.

In one embodiment, the substrate 106 has a substrate electrically conductive contact 108 corresponding to each primary electrically conductive pillar 104 and the primary integrated circuit device 102 has a primary electrically conductive contact 112 for each secondary electrically conductive contact 116 and vice versa. In a further embodiment, a substrate 106, a primary integrated circuit device 102, and/or a secondary integrated circuit device 114 may also have extraneous electrically conductive contacts 108, 112, 116.

For example, in one embodiment, the substrate 106 may have substrate electrically conductive contacts 108 for compatibility with several types of primary integrated circuit devices 102, with different patterns of primary electrically conductive pillars 104. A generic substrate 106 may have a generic array of substrate electrically conductive contacts 108 for use with many different patterns of primary electrically conductive pillars 104. A new design of a primary integrated circuit device 102 may eliminate certain primary electrically conductive pillars 104, but may be used with a substrate 106 that still has substrate electrically conductive contacts 108 corresponding to the eliminated primary electrically conductive pillars 104. Similarly, for example, a primary integrated circuit device 102 may have primary electrically conductive contacts 112 for compatibility with several types of secondary integrated circuit devices 114.

Further, for clarity, the depicted embodiment 200 includes six-by-four rectangular arrays of primary and secondary electrically conductive contacts 112, 116 and twelve-by-twenty rectangular arrays of primary electrically conductive pillars 104 and substrate electrically conductive contacts 108, with spaces 202, 204 for the secondary integrated circuit devices 114. Further embodiments may include various amounts of primary and secondary electrically conductive contacts 112, 116 and of primary electrically conductive pillars 104 and substrate electrically conductive contacts 108 in different patterns. For example, in one embodiment, the primary integrated circuit device 102 may include hundreds or thousands of primary electrically conductive pillars 104 and/or primary electrically conductive contacts 112 corresponding to similar amounts of substrate electrically conductive contacts 108 and/or secondary electrically conductive contacts 116.

Figure 3:
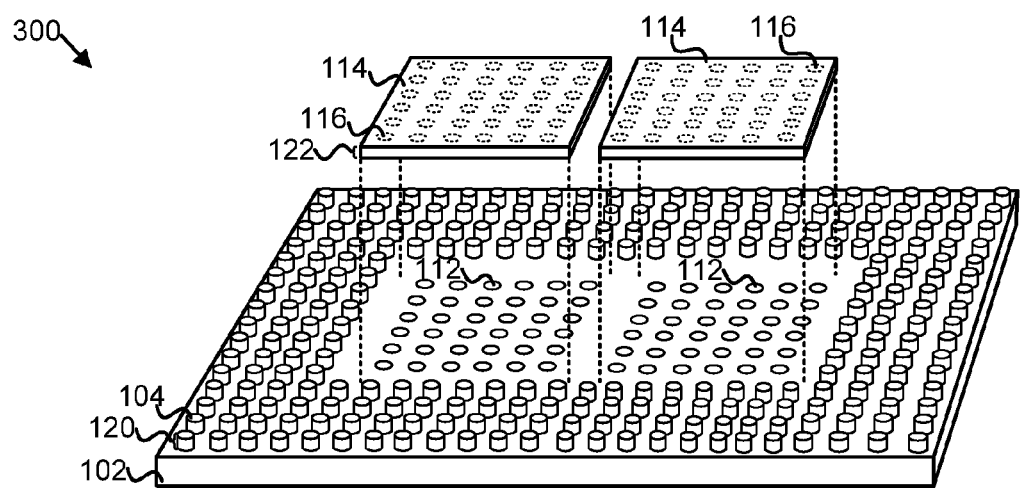
FIG. 3 is a schematic block diagram illustrating a further embodiment of integrated circuit devices in accordance with the present invention.

FIG. 3 depicts a further embodiment of the primary integrated circuit device 102 and two secondary integrated circuit devices 114. In the depicted embodiment, the primary electrically conductive contacts 112 form a pattern that corresponds to the secondary electrically conductive contacts 116 on the two secondary integrated circuit devices 114. The primary electrically conductive pillars 104 form a pattern that is separate from and does not directly overlap the pattern of the primary electrically conductive contacts 112, providing room for the secondary integrated circuit devices 114 to be placed directly onto the primary integrated circuit device 102.

In the depicted embodiment, the standoff height 120 provided by the primary integrated circuit device 102 and associated substrate connecting material 110 is greater than or equal to the height 122 of the secondary integrated circuit devices 114, allowing the secondary integrated circuit devices 114 to fit between the primary integrated circuit device 102 and the substrate 106 in a three dimensional stack. In a further embodiment, the one or more of the secondary integrated circuit devices 114 may have different heights 122, and the standoff height 120 is greater than or equal to the tallest height 122 of a secondary integrated circuit device 114 and corresponding secondary connecting material 118.

Figure 4A:
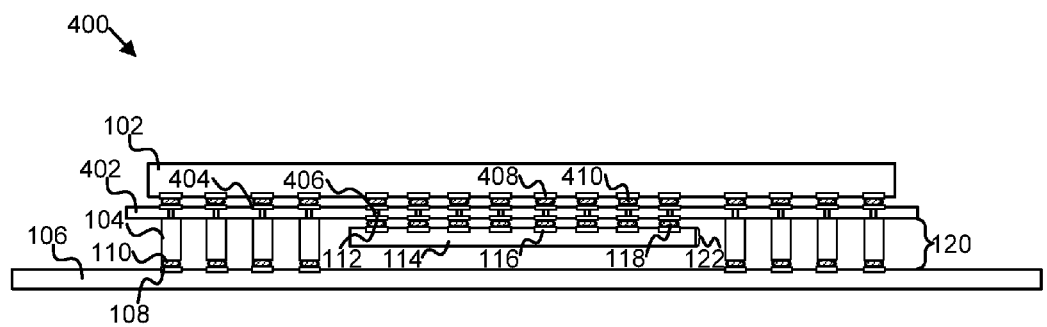
FIG. 4A is a schematic block diagram illustrating one embodiment of a system to connect integrated circuit devices in accordance with the present invention.
Figure 4B:
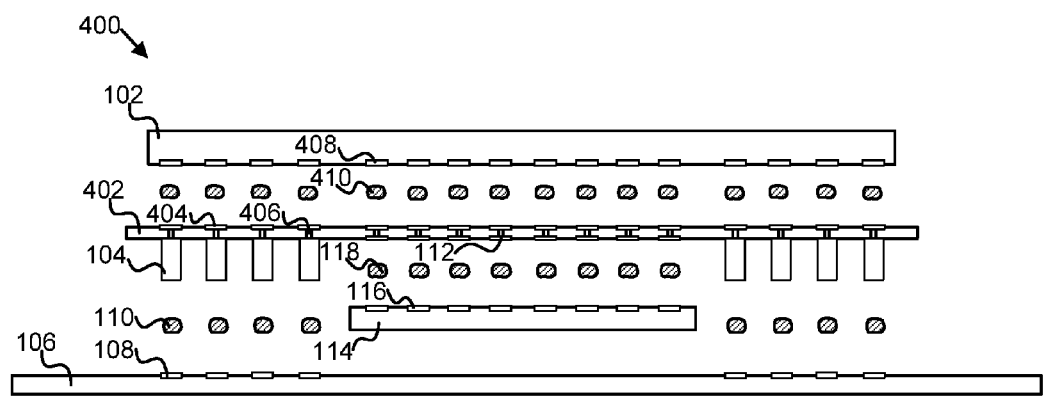
FIG. 4B is a schematic block diagram illustrating another embodiment of a system to connect integrated circuit devices in accordance with the present invention.

FIGS. 4A and 4B depict another embodiment of a system 400 to connect integrated circuit devices. The system 400, in the depicted embodiment, is substantially similar to the system 100 of FIG. 1, but further includes an interposer layer 402 between the primary integrated circuit device 102 and the secondary integrated circuit device 114.

The interposer layer 402, in one embodiment, may provide a generic interface for several different types of primary integrated circuit devices 102, allowing placement of one or more secondary integrated circuit devices 114 between the substrate 106 and the primary integrated circuit device 102 even if the primary integrated circuit device 102 does not include the primary electrically conductive pillars 104. In a further embodiment, several primary integrated circuit devices 102 may be electrically coupled to the interposer layer 402.

In the depicted embodiment, the primary electrically conductive contacts 112 and the primary electrically conductive pillars 104 are disposed on a first surface of the interposer layer 402, instead of on the primary integrated circuit device 102. Electrically conductive contacts 408 of the primary integrated circuit device 102 are electrically coupled to interposer electrically conductive contacts 404 that are disposed on a second surface of the interposer layer 402. In one embodiment, interposer connecting material 410 electrically couples the electrically conductive contacts 408 of the primary integrated circuit device 102 to the interposer electrically conductive contacts 404.

In the depicted embodiment, the primary electrically conductive contacts 112 and the primary electrically conductive pillars 104 are electrically coupled to the electrically conductive contacts 408 of the primary integrated circuit device 102 through internal electrical connections 406 in the interposer layer 402. The internal electrical connections 406, in various embodiments, may include through-vias with an electrical conductor, internal wiring within the interposer layer 402, and/or another electrical connection through the interposer layer 402.

In the depicted embodiment, the internal electrical connections 406 provide a one-to-one pass-through connection between the electrically conductive contacts 408 of the primary integrated circuit device 102 and the primary electrically conductive contacts 112 and the primary electrically conductive pillars 104. In a further embodiment, the internal electrical connections 406 may reroute electrical connections between the electrically conductive contacts 408 of the primary integrated circuit device 102 and the primary electrically conductive contacts 112 and the primary electrically conductive pillars 104, direct electrical connections to other components, or the like.

In one embodiment, the interposer layer 402 provides one or more external electrical connections for the primary integrated circuit device 102 and/or the secondary integrated circuit device 114. For example, the interposer layer 402 may provide an external electrical connection to power, ground, a fan, an electrical connector, or the like. An external electrical connection, in one embodiment, may be connected to one or more of the internal electrical connections 406.

Figure 5A:
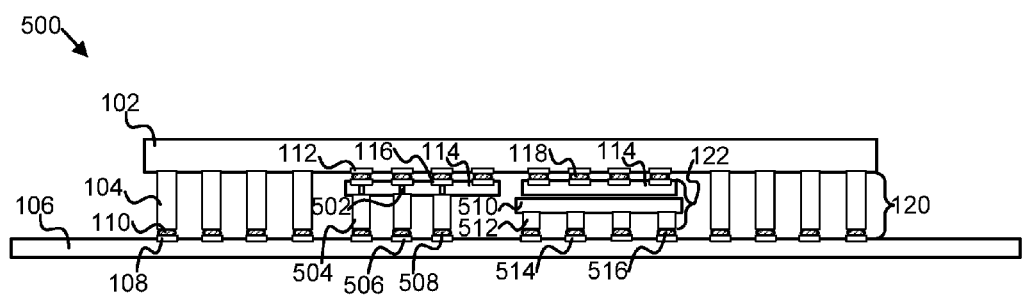
FIG. 5A is a schematic block diagram illustrating one embodiment of a system to connect integrated circuit devices in accordance with the present invention.
Figure 5B:
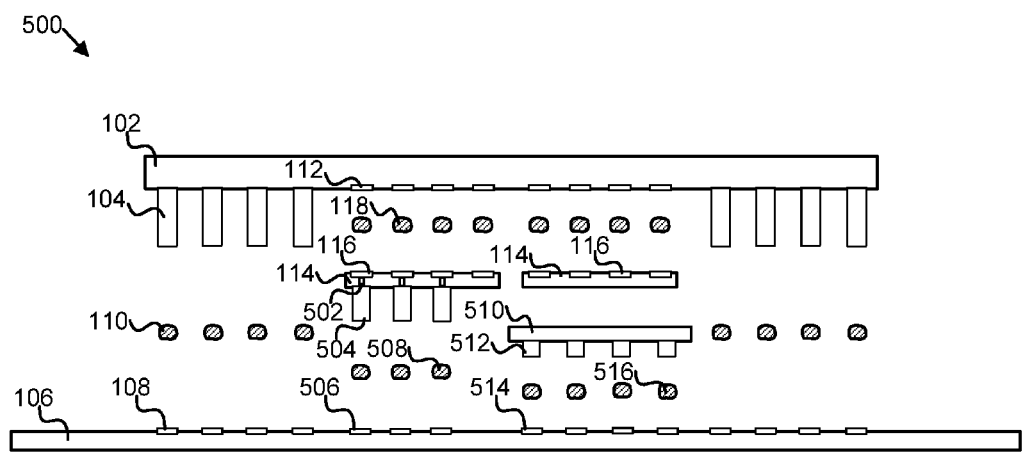
FIG. 5B is a schematic block diagram illustrating another embodiment of a system to connect integrated circuit devices in accordance with the present invention.

FIGS. 5A and 5B depict an additional embodiment of a system 500 to connect integrated circuit devices. The system 500, in the depicted embodiment, is substantially similar to the system 100 of FIG. 1, but further includes two secondary integrated circuit devices 114, secondary electrically conductive pillars 504, a tertiary integrated circuit device 510, and tertiary electrically conductive pillars 512. The tertiary integrated circuit device 510, in the depicted embodiment, is a second layer of integrated circuit devices between the primary integrated circuit device 102 and the substrate 106. In further embodiments, the system 500 may include more than one tertiary integrated circuit device 510.

In the depicted embodiment, the system 500 includes the two secondary integrated circuit devices 114, one of which includes the secondary electrically conductive pillars 504. In further embodiments, the system 500 may include more or less secondary integrated circuit devices 114, any of which may include one or more secondary electrically conductive pillars 504. In one embodiment, the secondary electrically conductive pillars 504 and/or the tertiary electrically conductive pillars 512 may be formed in a substantially similar manner of substantially similar materials as those described above with regard to the primary electrically conductive pillars 104 of FIG. 1.

In the depicted embodiment, the secondary electrically conductive pillars 504 extend from one of the secondary integrated circuit devices 114. The secondary electrically conductive pillars 504 are disposed on an opposite side of the secondary integrated circuit device 114 as the secondary electrically conductive contacts 116. The secondary electrically conductive pillars 504 form a pattern corresponding to additional substrate electrically conductive contacts 506 that are disposed on the substrate 106. In the depicted embodiment, additional substrate connecting material 508 electrically couples the secondary electrically conductive pillars 504 to the additional substrate electrically conductive contacts 506.

A height of the secondary electrically conductive pillars 504 and the associated substrate connecting material 508, in the depicted embodiment, is sized to match the standoff height 120 provided by the primary electrically conductive pillars 104 and associated substrate connecting material 110. Matching the standoff height 120 with the height of the secondary electrically conductive pillars 504 allows the primary electrically conductive pillars 104 and the secondary electrically conductive pillars 504 to be electrically coupled to a single, uniform substrate 106. In a further embodiment, the standoff height 120 may be sized to match a height of the secondary integrated circuit devices 114, and one or more of the secondary integrated circuit devices 114 may be electrically coupled to the additional substrate electrically conductive contacts 506 using contact pads or the like instead of using secondary electrically conductive pillars 504.

In the depicted embodiment, one of the secondary integrated circuit devices 114 includes internal electrical connections 502. Each internal electrical connection 502 within the secondary integrated circuit device 114, in the depicted embodiment, electrically couples one of the secondary electrically conductive contacts 116 to an opposite secondary electrically conductive contact, such as the secondary electrically conductive pillars 504 or another electrically conductive contact, on an opposite side of the secondary integrated circuit device 114. The internal electrical connections 502, in various embodiments, may include internal wiring, through-silicon vias, or another type of electrical connection.

In the depicted embodiment, the internal electrical connections 502 provide a one-to-one pass-through connection between the secondary electrically conductive contacts 116 and the secondary electrically conductive pillars 504. In a further embodiment, the internal electrical connections 502 may reroute electrical connections between the secondary electrically conductive contacts 116 and the secondary electrically conductive pillars 504, direct electrical connections to other internal components within the secondary integrated circuit device 114, or the like.

In the depicted embodiment, the tertiary integrated circuit device 510 is adjacent to one of the secondary integrated circuit devices 114. The secondary integrated circuit device 114, in the depicted embodiment, is between the tertiary integrated circuit device 510 and the primary integrated circuit device 102. The standoff height 120 provided by the primary electrically conductive pillars 104 and the associated substrate connecting material 110, in the depicted embodiment, is greater than or equal to a combined height 122 of the secondary integrated circuit devices 114, the tertiary integrated circuit device 510, and the associated substrate connecting material 516.

In the depicted embodiment, the tertiary electrically conductive pillars 512 extend from a surface of the tertiary integrated circuit device 510. The tertiary electrically conductive pillars 512 form a pattern corresponding to additional substrate electrically conductive contacts 514 on the substrate 106. Like the secondary electrically conductive pillars 504, in the depicted embodiment, a height of the tertiary electrically conductive pillars 512 and the associated substrate connecting material 516 is sized to match the standoff height 120 provided by the primary electrically conductive pillars 104 and the associated substrate connecting material 110.

Matching the height of the tertiary electrically conductive pillars 512 with the standoff height 120, in one embodiment, allows the primary electrically conductive pillars 104 and the tertiary electrically conductive pillars 512 to be electrically coupled to a single, uniform substrate 106. In a further embodiment, the standoff height 120 may be sized to match a height of the tertiary integrated circuits 510, and the tertiary integrated circuit 510 may be electrically coupled to the additional substrate electrically conductive contacts 514 using contact pads or the like instead of using tertiary electrically conductive pillars 512.

In the depicted embodiment, the tertiary electrically conductive pillars 512 and the associated substrate connecting material 516 electrically couple the tertiary integrated circuit device 510 to the additional substrate electrically conductive contacts 514 on the substrate 106. In a further embodiment, the tertiary integrated circuit device 510 may be electrically coupled to one or more of the secondary integrated circuit devices 114. For example, the tertiary integrated circuit device 510 may be flipped and electrically coupled to electrically conductive contacts on one or more of the secondary integrated circuit devices 114, electrically conductive contacts on an opposite side of the tertiary integrated circuit device 510 as the tertiary electrically conductive pillars 512 may be electrically coupled to electrically conductive contacts on one or more of the secondary integrated circuit devices 114, or the like.

Figure 6A:
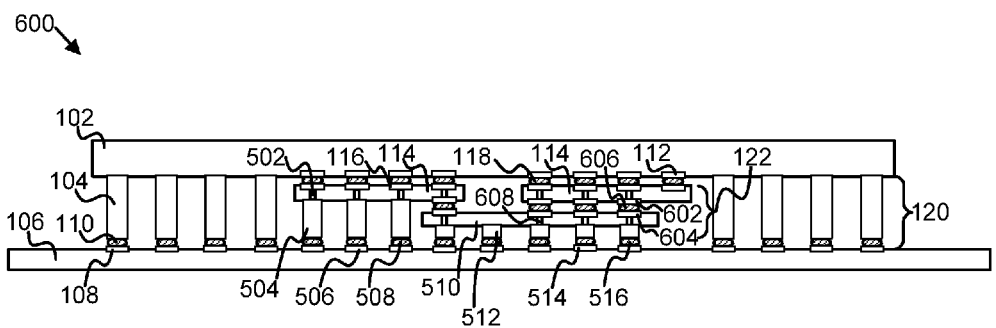
FIG. 6A is a schematic block diagram illustrating one embodiment of a system to connect integrated circuit devices in accordance with the present invention.
Figure 6B:
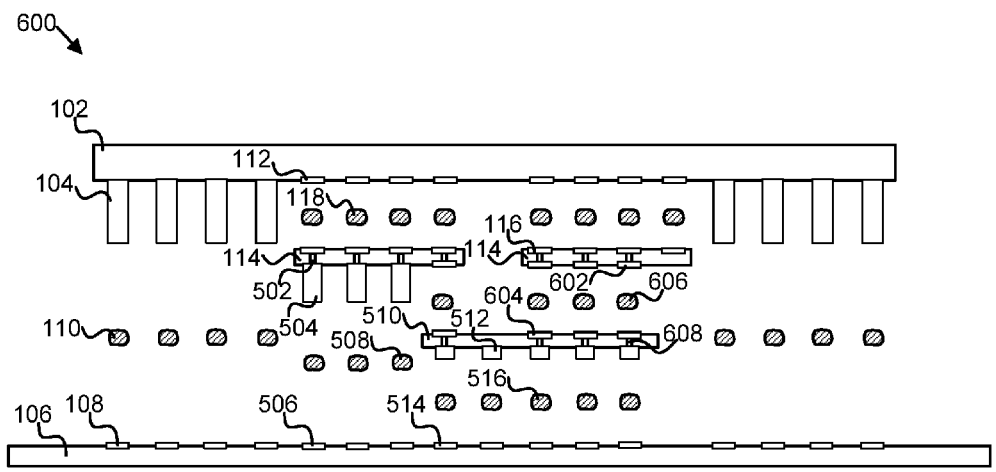
FIG. 6B is a schematic block diagram illustrating another embodiment of a system to connect integrated circuit devices in accordance with the present invention.

FIGS. 6A and 6B depict a further embodiment of a system 600 to connect integrated circuit devices. The system 600, in the depicted embodiment, is substantially similar to the system 500 depicted in FIGS. 5A and 5B, but the tertiary integrated circuit device 510 is electrically coupled to both of the secondary integrated circuit devices 114 and includes internal electrical connections 608.

In the depicted embodiment, the tertiary integrated circuit device 510 is electrically coupled to the substrate 106 and to both of the secondary integrated circuit devices 114, bridging the secondary integrated circuit devices 114. Tertiary connecting material 606, in the depicted embodiment, electrically couples opposite secondary electrically conductive contacts 602 on the secondary integrated circuit devices 114 to tertiary electrically conductive contacts 604 on the tertiary integrated circuit device 510.

The tertiary integrated circuit device 510, in the depicted embodiment, includes the internal electrical connections 608. The internal electrical connections 608, in various embodiments, may include internal wiring, through-silicon vias, or another type of electrical connection. In the depicted embodiment, the internal electrical connections 608 provide a one-to-one pass-through connection between the tertiary electrically conductive contacts 604 and the tertiary electrically conductive pillars 512. In a further embodiment, the internal electrical connections 608 may reroute electrical connections between the tertiary electrically conductive contacts 604 and the tertiary electrically conductive pillars 512, direct electrical connections to other internal components within the tertiary integrated circuit device 510, provide electrical connections between the secondary integrated circuit devices 114, or the like.

Figure 7:
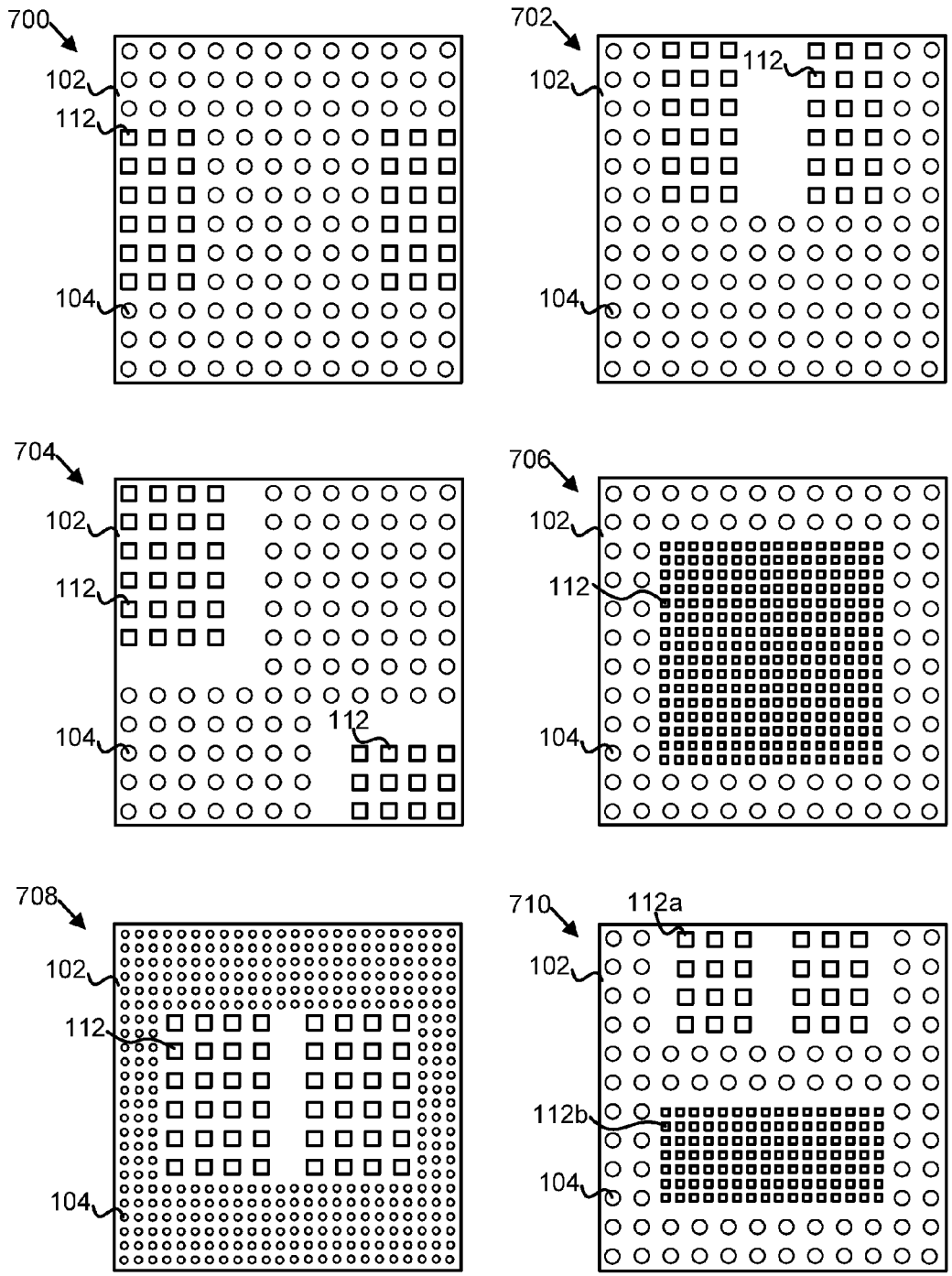
FIG. 7 is a schematic block diagram illustrating embodiments of a primary integrated circuit device in accordance with the present invention.

FIG. 7 depicts various embodiments 700, 702, 704, 706, 708, 710 of the primary integrated circuit device 102. In the depicted embodiments 700, 702, 704, 706, 708, 710, the primary electrically conductive pillars 104 are depicted as circles and the primary electrically conductive contacts 112 are depicted as squares for purposes of differentiation. Further, in the depicted embodiments 700, 702, 704, 706, 708, 710, the primary electrically conductive pillars 104 and the primary electrically conductive contacts 112 are disposed on a primary integrated circuit device 102. As described with regard to FIGS. 4A and 4B, in further embodiments, the primary electrically conductive pillars 104 and the primary electrically conductive contacts 112 may be disposed on the interposer layer 402, or the like instead of on a primary integrated circuit device 102.

In the first embodiment 700, the arrays of primary electrically conductive contacts 112 are disposed toward opposite side edges of the primary integrated circuit device 102, with primary electrically conductive pillars 104 between the two patterns of primary electrically conductive contacts 112. In the first embodiment 700, the primary electrically conductive pillars 104 and the primary electrically conductive contacts 112 have a substantially similar pitch, or separation distance between adjacent pillars and/or contacts. The arrays of primary electrically conductive contacts 112, in the first embodiment 700, are each similarly sized, and may correspond to similar secondary integrated circuit devices 114.

In the second embodiment 702, the arrays of primary electrically conductive contacts 112 are disposed toward a single side edge of the primary integrated circuit device 102, and the primary integrated circuit device 102 has no primary electrically conductive pillars 104 between the two patterns of primary electrically conductive contacts 112. In the second embodiment 702, the primary electrically conductive pillars 104 and the primary electrically conductive contacts 112 have a substantially similar pitch. The arrays of primary electrically conductive contacts 112, in the second embodiment 702, are each similarly sized, and may correspond to similar secondary integrated circuit devices 114.

\In the third embodiment 704, the arrays of primary electrically conductive contacts 112 are disposed toward corners of the primary integrated circuit device 102. In the third embodiment 704, the primary electrically conductive pillars 104 and the primary electrically conductive contacts 112 have a substantially similar pitch. The arrays of primary electrically conductive contacts 112, in the third embodiment 704, have different sizes, and may, for example, correspond to different sizes and/or types of secondary integrated circuit devices 114.

In the fourth embodiment 706, a single array of primary electrically conductive contacts 112 is disposed toward the center of the primary integrated circuit device 102, with the primary electrically conductive pillars 104 disposed toward a perimeter of the primary integrated circuit device 102. The primary electrically conductive pillars 104 circumscribe the primary electrically conductive contacts 112 in the fourth embodiment 706. In the fourth embodiment 706, the primary electrically conductive contacts 112 have a different pitch than the primary electrically conductive pillars 104.

In the fifth embodiment 708, the arrays of primary electrically conductive contacts 112 are disposed toward the center of the primary integrated circuit device 102 and the primary electrically conductive pillars 104 are disposed toward a perimeter of the primary integrated circuit device 102. The primary electrically conductive pillars 104 circumscribe both arrays of primary electrically conductive contacts 112 in the fifth embodiment 708. The primary electrically conductive contacts 112, in the fifth embodiment 708, have a different pitch than the primary electrically conductive pillars 104.

The sixth embodiment 710 includes three arrays of primary electrically conductive contacts 112. The first two arrays of primary electrically conductive contacts 112a, in the sixth embodiment 710, are disposed toward an edge of the primary integrated circuit device 102, are similarly shaped, and have a substantially similar pitch as the primary electrically conductive pillars 104. The third array of primary electrically conductive contacts 112b, in the sixth embodiment 710, is disposed toward the center of the primary integrated circuit device 102. The third array of primary electrically conductive contacts 112b has a different shape than the first two arrays of primary electrically conductive contacts 112a and has a different pitch than the first two arrays of primary electrically conductive contacts 112a. One of skill in the art, in light of this disclosure, will recognize other combinations and variations of primary electrically conductive contacts 112 and primary electrically conductive pillars 104 for a primary integrated circuit device 102.

Figure 8:
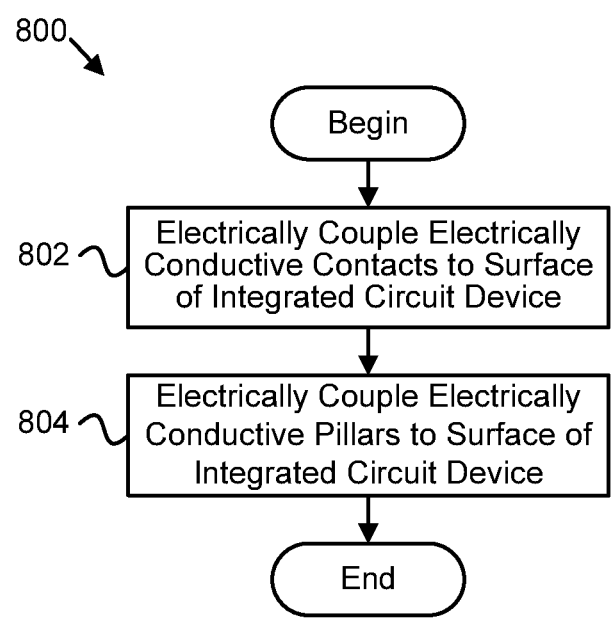
FIG. 8 is a schematic flow chart diagram illustrating one embodiment of a method for connecting integrated circuit devices in accordance with the present invention.

FIG. 8 depicts one embodiment of a method 800 for connecting integrated circuit devices. The method 800 begins and a device assembler electrically couples 802 the primary electrically conductive contacts 112 to a surface of the primary integrated circuit device 102. The device assembler may include one or more automated assembly devices, assembly workers, assembly tools, or the like. The device assembler electrically couples 804 the primary electrically conductive pillars 104 to the surface of the primary integrated circuit device 102 and the method 800 ends.

The device assembler, in various embodiments, may electrically couple 802 the primary electrically conductive contacts 112 and/or electrically couple 804 the primary electrically conductive pillars 104 by plating an electrically conductive material such as copper, nickel, gold, an alloy, or the like onto a seed layer on the primary integrated circuit device 102 using a resist coat or other mask, may evaporate an electrically conductive material through a suitable mask, or may otherwise electrically couple 802, 804 the primary electrically conductive contacts 112 and/or electrically couple 804 the primary electrically conductive pillars 104 to the primary integrated circuit device 102. A process of plating the primary electrically conductive pillars 104 and/or the primary electrically conductive contacts 112 onto a surface of the primary integrated circuit device 102 may include several treatments. In one embodiment, the primary electrically conductive contacts 112 may undergo fewer treatments than the primary electrically conductive pillars 104, or may undergo a different process.

The device assembler, in one embodiment, arranges the primary electrically conductive pillars 104 in a pattern corresponding to a pattern of the substrate electrically conductive contacts 108. In one embodiment, the device assembler arranges the primary electrically conductive contacts 112 in a pattern corresponding to a pattern of the secondary electrically conductive contacts 116. The device assembler may electrically couple 802, 804 the primary electrically conductive pillars 104 and the primary electrically conductive contacts 112 to the primary integrated circuit device 102 simultaneously, for example during a single plating process (or series of plating processes), or may electrically couple 802, 804 the primary electrically conductive pillars 104 and the primary electrically conductive contacts 112 independently of each other.

Figure 9:
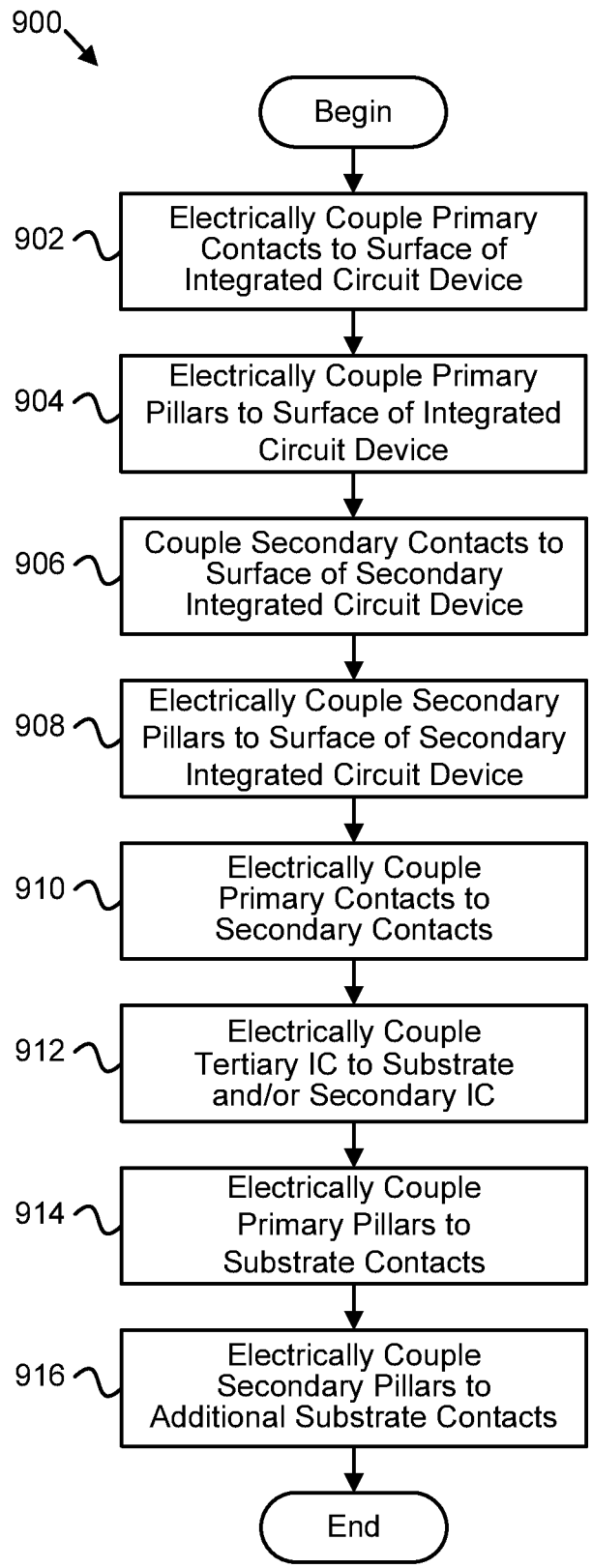
FIG. 9 is a schematic flow chart diagram illustrating another embodiment of a method for connecting integrated circuit devices in accordance with the present invention.

FIG. 9 depicts another embodiment 900 of a method 900 for connecting integrated circuit devices. The method 900 begins and a device assembler electrically couples 902 the primary electrically conductive contacts 112 to a surface of the primary integrated circuit device 102 and electrically couples 904 the primary electrically conductive pillars 104 to the surface of the primary integrated circuit device 102, as described above with regard to the method 800 of FIG. 8.

In one embodiment, the device assembler electrically couples 906 the secondary electrically conductive contacts 116 to surfaces of one or more secondary integrated circuit devices 114. In a further embodiment, the device assembler electrically couples 908 the secondary electrically conductive pillars 504 to opposite surfaces of one or more secondary integrated circuit devices 114. The device assembler may electrically couple 906, 908 the secondary electrically conductive contacts 116 and/or the secondary electrically conductive pillars 504 to one or more of the secondary integrated circuit devices 114 in a substantially similar manner as described above with regard to electrically coupling the primary electrically conductive contacts 112 and the primary electrically conductive pillars 104 to the surface of the primary integrated circuit device 102.

The device assembler, in the depicted embodiment, electrically couples 910 the primary electrically conductive contacts 112 of the primary integrated circuit device 102 to the secondary electrically conductive contacts 116 of the one or more secondary integrated circuit devices 114 using the secondary connecting material 118. The device assembler, in one embodiment, may initially place the secondary connecting material 118 on the primary electrically conductive contacts 112, the secondary electrically conductive contacts 116, or both. Upon electrically coupling 910 the primary electrically conductive contacts 112 of the primary integrated circuit device 102 to the secondary electrically conductive contacts 116 of the one or more secondary integrated circuit devices 114, in one embodiment, the one or more secondary integrated circuit devices 114 are mechanically and electrically coupled to a surface of the primary integrated circuit device 102.

In one embodiment, the device assembler electrically couples 912 one or more tertiary integrated circuit devices 510 to the additional substrate electrically conductive contacts 514 and/or to the opposite secondary electrically conductive contacts 602 of one or more secondary integrated circuit devices 114. The device assembler, in various embodiments, may electrically couple 912 the tertiary electrically conductive pillars 512 to the additional substrate electrically conductive contacts 514 and/or to the opposite secondary electrically conductive contacts 602, may electrically couple 912 the tertiary electrically conductive contacts 604 to the additional substrate electrically conductive contacts 514 and/or to the opposite secondary electrically conductive contacts 602, or may otherwise electrically couple 912 one or more tertiary integrated circuit devices 510 to the additional substrate electrically conductive contacts 514 and/or to the opposite secondary electrically conductive contacts 602 of one or more secondary integrated circuit devices 114.

In the depicted embodiment, the device assembler electrically couples 914 the primary electrically conductive pillars 104 to the substrate electrically conductive contacts 108 and electrically couples 916 the secondary electrically conductive pillars 504 to the additional substrate electrically conductive contacts 506 using the substrate connecting material 110, 508 and the method 900 ends. The device assembler, in one embodiment, may electrically couple 912, 914, 916 the primary electrically conductive pillars 104, the secondary electrically conductive pillars 504, and/or the tertiary electrically conductive pillars 512 to the substrate 106 in a single process, such as reflow soldering or the like, because the heights of the primary electrically conductive pillars 104, the secondary electrically conductive pillars 504, and the tertiary electrically conductive pillars 512 are sized to match the standoff height 120.

In one embodiment, the substrate connecting material 110, 508, 516, the secondary connecting material 118, and/or the tertiary connecting material 606 comprise a solder material, and the device assembler may perform one or more of the electrically coupling steps 910, 912, 914, 916 by melting the substrate connecting material 110, 508, 516, the secondary connecting material 118, and/or the tertiary connecting material 606. For example, in one embodiment, the substrate connecting material 110, 508, 516, the secondary connecting material 118, and/or the tertiary connecting material 606 may include a lead-free solder such as tin-silver solder, tin-silver-copper solder, or the like. The device assembler, in various embodiments, may melt the substrate connecting material 110, 508, 516, the secondary connecting material 118, and/or the tertiary connecting material 606 in a furnace, such as a belt furnace, a vacuum furnace, a box furnace, or the like, using conduction, convection, infrared, or other heating. In a further embodiment, the connected primary integrated circuit device 102 and substrate 106 may undergo further processing, such as quality checks for non-wet connections, flux cleaning, under-filling, connection to additional devices and/or components, and the like.

The device assembler, in one embodiment, may melt the substrate connecting material 110, 508, 516, the secondary connecting material 118, and/or the tertiary connecting material 606 in a series of reflow soldering processes in a variety of different orders. In one embodiment, one or more of the substrate connecting material 110, 508, 516, the secondary connecting material 118, and/or the tertiary connecting material 606 may be melted multiple times during the method 900, and the corresponding components may be held together during subsequent reflow processes by a surface tension of the associated connecting material 110, 118, 508, 516, 606.

For example, the device assembler may electrically couple 910 one or more secondary integrated circuit devices 114 to the primary integrated circuit device 102 during a first reflow process and electrically couple 914, 916 the primary integrated circuit device 102 and/or one or more of the secondary integrated circuit devices 114 to the substrate 106 during a subsequent reflow process. The subsequent reflow process may re-melt the secondary connecting material 118 and, in one embodiment, a surface tension of the secondary connecting material 118 may hold the one or more secondary integrated circuit devices 114 to the primary integrated circuit device 102, even if not supported by the secondary electrically conductive pillars 504 or other mechanical support elements.

Embodiments of the present invention may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes," "has," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus to connect integrated circuit devices, the apparatus comprising:
   a primary integrated circuit device;
   a plurality of primary electrically conductive contacts electrically coupled to a surface of the primary integrated circuit device, the plurality of primary electrically conductive contacts forming a pattern corresponding to secondary electrically conductive contacts disposed on one or more secondary integrated circuit devices; and
   a plurality of primary electrically conductive pillars electrically coupled to the surface of the primary integrated circuit device, the plurality of primary electrically conductive pillars extending away from the surface of the primary integrated circuit device, the plurality of primary electrically conductive pillars forming a pattern corresponding to substrate electrically conductive contacts disposed on a substrate, the plurality of primary electrically conductive pillars and associated connecting material providing a standoff height between the primary integrated circuit device and the substrate that is greater than or equal to a height of the one or more secondary integrated circuit devices, wherein the plurality of primary electrically conductive pillars support the primary integrated circuit device without a substrate surrounding the plurality of primary electrically conductive pillars in a space between the primary integrated circuit and the substrate with the electrically conductive contacts.

2. The apparatus of claim 1, further comprising a plurality of secondary electrically conductive pillars extending from at least one of the one or more secondary integrated circuit devices, the secondary electrically conductive pillars disposed on an opposite side of the at least one secondary integrated circuit device as the secondary electrically conductive contacts, the plurality of secondary electrically conductive pillars forming a pattern corresponding to additional substrate electrically conductive contacts disposed on the substrate, wherein a height of the secondary electrically conductive pillars and associated connecting material is sized to match the standoff height provided by the plurality of primary electrically conductive pillars and associated connecting material.

3. The apparatus of claim 1, further comprising one or more internal electrical connections within at least one of the one or more secondary integrated circuit devices, each of the one or more internal electrical connections electrically coupling one of the secondary electrically conductive contacts to an opposite secondary electrically conductive contact disposed on an opposite side of the at least one secondary integrated circuit device as the secondary electrically conductive contacts.

4. The apparatus of claim 3, wherein the one or more internal electrical connections each comprise a through-silicon via disposed within the at least one secondary integrated circuit device.

5. The apparatus of claim 3, wherein the opposite secondary electrically conductive contact is selected from the group consisting of a secondary electrically conductive pillar corresponding to an additional electrically conductive contact disposed on the substrate and an electrically conductive contact corresponding to a tertiary electrically conductive contact disposed on a tertiary integrated circuit device.

6. The apparatus of claim 1, further comprising one or more tertiary integrated circuit devices disposed adjacent to at least one of the one or more secondary integrated circuit devices such that the at least one secondary integrated circuit device is between the one or more tertiary integrated circuit devices and the primary integrated circuit device, wherein the standoff height provided by the plurality of primary electrically conductive pillars and associated connecting material is greater than or equal to a combined height of the one or more secondary integrated circuit devices, the one or more tertiary integrated circuit devices, and associated connecting material.

7. The apparatus of claim 6, wherein at least one of the one or more tertiary integrated circuit devices is electrically coupled to one of the one or more secondary integrated circuit devices.

8. The apparatus of claim 7, wherein the at least one tertiary integrated circuit device is further electrically coupled to additional substrate electrically conductive contacts disposed on the substrate.

9. The apparatus of claim 6, further comprising a plurality of tertiary electrically conductive pillars extending from a surface of at least one of the one or more tertiary integrated circuit devices, the plurality of tertiary electrically conductive pillars forming a pattern corresponding to additional substrate electrically conductive contacts disposed on the substrate, wherein a height of the tertiary electrically conductive pillars and associated connecting material is sized to match the standoff height provided by the plurality of primary electrically conductive pillars and associated connecting material.

10. The apparatus of claim 6, wherein at least one of the tertiary integrated circuit devices is electrically coupled to a plurality of the one or more secondary integrated circuit devices.

11. The apparatus of claim 1, further comprising an interposer layer, wherein the plurality of primary electrically conductive contacts and the plurality of primary electrically conductive pillars are electrically coupled to the primary integrated circuit device through the interposer layer, wherein the plurality of primary electrically conductive contacts and the plurality of primary electrically conductive pillars are disposed on a first surface of the interposer layer and corresponding electrically conductive contacts of the primary integrated circuit device are electrically coupled to a second surface of the interposer layer.

12. The apparatus of claim 1, wherein a surface area of the surface of the primary integrated circuit device is larger than a combined surface area of opposing surfaces of the one or more secondary integrated circuit devices, the opposing surfaces of the one or more secondary integrated circuit devices facing the surface of the primary integrated circuit device.

13. The apparatus of claim 1, wherein the primary integrated circuit device, the one or more secondary integrated circuit devices, and the substrate are arranged in a stack, the one or more secondary integrated circuit devices disposed between the primary integrated circuit device and the substrate in the stack.

14. The apparatus of claim 1, wherein the plurality of primary electrically conductive pillars comprise copper.

15. A system to connect integrated circuit devices, the system comprising:
　a primary integrated circuit device;
　one or more secondary integrated circuit devices comprising a plurality of secondary electrically conductive contacts;
　a substrate comprising substrate electrically conductive contacts;
　a plurality of primary electrically conductive contacts electrically coupled to a surface of the primary integrated circuit device and to the plurality of secondary electrically conductive contacts; and
　a plurality of primary electrically conductive pillars electrically coupled to the surface of the primary integrated circuit device and to the substrate electrically conductive contacts, the plurality of primary electrically conductive pillars extending away from the surface of the primary integrated circuit device, the plurality of primary electrically conductive pillars and associated connecting material providing a standoff height between the primary integrated circuit device and the substrate that is greater than or equal to a height of the one or more secondary integrated circuit devices, wherein the plurality of primary electrically conductive pillars support the primary integrated circuit device without a substrate surrounding the plurality of primary electrically conductive pillars in a space between the primary integrated circuit and the substrate with the electrically conductive contacts.

16. The system of claim 15, further comprising a plurality of secondary electrically conductive pillars extending from at least one of the one or more secondary integrated circuit devices, the secondary electrically conductive pillars disposed on an opposite side of the at least one secondary integrated circuit device as the secondary electrically conductive contacts, the plurality of secondary electrically conductive pillars electrically coupled to additional substrate electrically conductive contacts disposed on the substrate, wherein a height of the secondary electrically conductive pillars and associated connecting material is sized to match the standoff height provided by the plurality of primary electrically conductive pillars and associated connecting material.

17. The system of claim 15, further comprising one or more tertiary integrated circuit devices disposed adjacent to at least one of the one or more secondary integrated circuit devices such that the at least one secondary integrated circuit device is between the one or more tertiary integrated circuit devices and the primary integrated circuit device, wherein the standoff height provided by the plurality of primary electrically conductive pillars and associated connecting material is greater than or equal to a combined height of the one or more secondary integrated circuit devices and the one or more tertiary integrated circuit devices.

18. The system of claim 17, further comprising a plurality of tertiary electrically conductive pillars extending from a surface of at least one of the one or more tertiary integrated circuit devices, the plurality of tertiary electrically conductive pillars forming a pattern corresponding to additional substrate electrically conductive contacts disposed on the substrate, wherein a height of the tertiary electrically conductive pillars and associated connecting material is sized to match the standoff height provided by the plurality of primary electrically conductive pillars and associated connecting material.

19. A method for connecting integrated circuit devices, the method comprising:
   electrically coupling a plurality of primary electrically conductive contacts to a surface of a primary integrated circuit device, the plurality of primary electrically conductive contacts forming a pattern corresponding to secondary electrically conductive contacts disposed on one or more secondary integrated circuit devices; and
   electrically coupling a plurality of primary electrically conductive pillars to the surface of the primary integrated circuit device, the plurality of primary electrically conductive pillars extending away from the surface of the primary integrated circuit device, the plurality of primary electrically conductive pillars forming a pattern corresponding to substrate electrically conductive contacts disposed on a substrate, the plurality of primary electrically conductive pillars and associated connecting material providing a standoff height between the primary integrated circuit device and the substrate that is greater than or equal to a height of the one or more secondary integrated circuit devices,
   wherein the plurality of primary electrically conductive pillars support the primary integrated circuit device without a substrate surrounding the plurality of primary electrically conductive pillars in a space between the primary integrated circuit and the substrate with the electrically conductive contacts.

20. The method of claim 19, further comprising electrically coupling the plurality of primary electrically conductive contacts to the plurality of secondary electrically conductive contacts and electrically coupling the plurality of primary electrically conductive pillars to the substrate electrically conductive contacts.

21. The method of claim 19, further comprising electrically coupling a plurality of secondary electrically conductive pillars to additional substrate electrically conductive contacts disposed on the substrate, the plurality of secondary electrically conductive pillars extending from at least one of the one or more secondary integrated circuit devices, the plurality of secondary electrically conductive pillars disposed on an opposite side of the at least one secondary integrated circuit device as the secondary electrically conductive contacts, wherein a height of the secondary electrically conductive pillars and associated connecting material is sized to match the standoff height provided by the plurality of primary electrically conductive pillars and associated connecting material.

22. The method of claim 19, further comprising electrically coupling one or more tertiary integrated circuit devices to at least one of a secondary integrated circuit device from the one or more secondary integrated circuit devices and additional substrate electrically conductive contacts disposed on the substrate such that at least one of the one or more secondary integrated circuit devices is between the one or more tertiary integrated circuit devices and the primary integrated circuit device, wherein the standoff height provided by the plurality of primary electrically conductive pillars and associated connecting material is greater than or equal to a combined height of the one or more secondary integrated circuit devices, the one or more tertiary integrated circuit devices, and associated connecting material.

23. An apparatus to connect integrated circuit devices, the apparatus comprising:
   a primary integrated circuit device;
   one or more secondary integrated circuit devices comprising a plurality of secondary electrically conductive contacts;
   a plurality of primary electrically conductive contacts electrically coupled to a surface of the primary integrated circuit device and to the plurality of secondary electrically conductive contacts;
   a plurality of primary electrically conductive pillars electrically coupled to the surface of the primary integrated circuit device, the plurality of primary electrically conductive pillars extending away from the surface of the primary integrated circuit device, the plurality of primary electrically conductive pillars forming a pattern corresponding to substrate electrically conductive contacts disposed on a substrate, the plurality of primary electrically conductive pillars and associated connecting material providing a standoff height between the primary integrated circuit device and the substrate that is greater than or equal to a height of the one or more secondary integrated circuit devices, wherein the plurality of primary electrically conductive pillars support the primary integrated circuit device without a substrate surrounding the plurality of primary electrically conductive pillars in a space between the primary integrated circuit and the substrate with the electrically conductive contacts; and
   a plurality of secondary electrically conductive pillars extending from at least one of the one or more secondary integrated circuit devices on an opposite side of the at least one secondary integrated circuit device as the secondary electrically conductive contacts, the plurality of secondary electrically conductive pillars forming a pattern corresponding to additional substrate electrically conductive contacts disposed on the substrate, a height of the plurality of secondary electrically conductive pillars and associated connecting material sized to match the standoff height provided by the plurality of primary electrically conductive pillars and associated connecting material.

24. The apparatus of claim 23, further comprising one or more internal electrical connections within the at least one secondary integrated circuit device, each of the one or more internal electrical connections electrically coupling one of the secondary electrically conductive pillars to one of the secondary electrically conductive contacts.

25. A system to connect integrated circuit devices, the system comprising:
- a primary integrated circuit device;
- one or more secondary integrated circuit devices comprising a plurality of secondary electrically conductive contacts;
- one or more tertiary integrated circuit devices disposed adjacent to at least one of the one or more secondary integrated circuit devices such that the at least one secondary integrated circuit device is between the one or more tertiary integrated circuit devices and the primary integrated circuit device;
- a substrate comprising substrate electrically conductive contacts and additional substrate electrically conductive contacts, the primary integrated circuit device, the one or more secondary integrated circuit devices, the one or more tertiary integrated circuit devices, and the substrate arranged in a stack with the one or more secondary integrated circuit devices and the one or more tertiary integrated circuit devices disposed between the primary integrated circuit device and the substrate in the stack;
- a plurality of primary electrically conductive contacts electrically disposed on a surface of the primary integrated circuit device, the plurality of primary electrically conductive contacts electrically coupled to the plurality of secondary electrically conductive contacts;
- a plurality of primary copper pillars disposed on the surface of the primary integrated circuit device, the plurality of primary copper pillars extending away from the surface of the primary integrated circuit device toward the substrate electrically conductive contacts, the plurality of primary copper pillars electrically coupled to the substrate electrically conductive contacts, the plurality of primary copper pillars and associated connecting material providing a standoff height between the primary integrated circuit device and the substrate that is greater than or equal to a combined height of the one or more secondary integrated circuit devices, the one or more tertiary integrated circuit devices, and associated connecting material, wherein the plurality of primary electrically conductive pillars support the primary integrated circuit device without a substrate surrounding the plurality of primary electrically conductive pillars in a space between the primary integrated circuit and the substrate with the electrically conductive contacts;
- a plurality of secondary copper pillars extending from at least one of the one or more secondary integrated circuit devices, the plurality of secondary copper pillars disposed on an opposite side of the at least one secondary integrated circuit device as the secondary electrically conductive contacts, the plurality of secondary copper pillars electrically coupled to the additional substrate electrically conductive contacts, a height of the secondary copper pillars and associated connecting material sized to match the standoff height provided by the plurality of primary electrically conductive pillars and associated connecting material; and
- a plurality of tertiary copper pillars extending from a surface of at least one of the one or more tertiary integrated circuit devices, the plurality of tertiary copper pillars electrically coupled to the additional substrate electrically conductive contacts, a height of the tertiary copper pillars and associated connecting material sized to match the standoff height provided by the plurality of primary electrically conductive pillars and associated connecting material.

* * * * *